United States Patent
Uemura

(10) Patent No.: US 9,455,672 B2
(45) Date of Patent: Sep. 27, 2016

(54) IV CONVERTER AND INERTIAL FORCE SENSOR USING IV CONVERTER

(71) Applicant: Panasonic Corporation, Osaka (JP)

(72) Inventor: Takeshi Uemura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 302 days.

(21) Appl. No.: 14/374,373

(22) PCT Filed: Mar. 11, 2013

(86) PCT No.: PCT/JP2013/001551
§ 371 (c)(1),
(2) Date: Jul. 24, 2014

(87) PCT Pub. No.: WO2013/140740
PCT Pub. Date: Sep. 26, 2013

(65) Prior Publication Data
US 2015/0013459 A1      Jan. 15, 2015

(30) Foreign Application Priority Data

Mar. 19, 2012   (JP) .................................. 2012-061457

(51) Int. Cl.
*H03F 1/00*      (2006.01)
*H03F 1/26*      (2006.01)
(Continued)

(52) U.S. Cl.
CPC ............. *H03F 1/26* (2013.01); *G01C 19/5614* (2013.01); *G01P 15/02* (2013.01); *H01L 41/042* (2013.01);
(Continued)

(58) Field of Classification Search
CPC ...................................................... H03F 1/26
See application file for complete search history.

(56) References Cited

U.S. PATENT DOCUMENTS 4,692,711 A    9/1987   Miyasako
5,237,493 A    8/1993   Durig et al.
(Continued)

FOREIGN PATENT DOCUMENTS

JP     62-018807 A    1/1987
JP     04-233475 A    8/1992
(Continued)

OTHER PUBLICATIONS

International Search Report for Application No. PCT/JP2013/001551 dated May 21, 2013.

*Primary Examiner* — David Gray
*Assistant Examiner* — Dennis Hancock
(74) *Attorney, Agent, or Firm* — Pearne & Gordon LLP

(57) ABSTRACT

An IV converter includes a first operational amplifier connected to the capacitive component, a second operational amplifier connected to the first operational amplifier, and an impedance element connected to the second operational amplifier. The first operational amplifier includes a first input terminal connected to the capacitive component, a second input terminal connected to a reference potential, and first and second output terminals. The first output terminal is connected to the first input terminal to constitute a feedback loop. The second operational amplifier includes a third input terminal connected to the second output terminal, a fourth input terminal connected to a reference potential, and a third output terminal connected to the third input terminal via the impedance element to constitute a feedback loop. The phases of the currents output by the first and second output terminals of the first operational amplifier are substantially identical to each other.

6 Claims, 8 Drawing Sheets

(51) Int. Cl.
  *G01C 19/5614* (2012.01)
  *H01L 41/04* (2006.01)
  *H01L 41/113* (2006.01)
  *H03F 1/34* (2006.01)
  *H03F 3/45* (2006.01)
  *G01P 15/02* (2013.01)
  *H02M 11/00* (2006.01)

(52) U.S. Cl.
  CPC ......... *H01L 41/1132* (2013.01); *H02M 11/00* (2013.01); *H03F 1/34* (2013.01); *H03F 3/45179* (2013.01); *H03F 3/45183* (2013.01); *H03F 3/45475* (2013.01); *H03F 2003/45008* (2013.01); *H03F 2200/261* (2013.01); *H03F 2200/372* (2013.01); *H03F 2203/45032* (2013.01); *H03F 2203/45116* (2013.01); *H03F 2203/45528* (2013.01); *H03F 2203/45674* (2013.01)

(56) References Cited

U.S. PATENT DOCUMENTS

| | | | | |
|---|---|---|---|---|
| 9,331,469 B2* | 5/2016 | Beck | ................ | H02H 3/162 |
| 2009/0163826 A1* | 6/2009 | Mouttet | ................ | G11C 11/54 |
| | | | | 600/544 |
| 2009/0244056 A1 | 10/2009 | Tsuchi | | |
| 2010/0156385 A1 | 6/2010 | Werking | | |
| 2014/0338469 A1* | 11/2014 | Fujita | ................ | G01L 1/10 |
| | | | | 73/862.59 |

FOREIGN PATENT DOCUMENTS

| | | | |
|---|---|---|---|
| JP | 07-066636 | A | 3/1995 |
| JP | 08-261764 | A | 10/1996 |
| JP | 2005-252810 | A | 9/2005 |
| JP | 2008-216187 | A | 9/2008 |
| JP | 2008-241330 | A | 10/2008 |
| JP | 2008-261844 | A | 10/2008 |
| JP | 2009-246741 | A | 10/2009 |
| JP | 2010-148094 | A | 7/2010 |

* cited by examiner

IV CONVERTER AND INERTIAL FORCE SENSOR USING IV CONVERTER

This application is a U.S. national stage application of the PCT international application number PCT/JP2013/001551.

TECHNICAL FIELD

The present invention relates to an IV converter used in automobiles, airplanes, ships, robots, and various other electronic devices, and an inertial force sensor using the IV converter.

BACKGROUND ART

FIG. 8 is a circuit diagram of conventional IV converter 1. Conventional IV converter 1 includes input terminal 3 connected to capacitive component 2, input terminal 4 connected to a reference potential, and output terminal 7 connected to input terminal 3 via resistor 5 to constitute feedback loop 6.

A conventional IV converter similar to IV converter 1 is described in, e.g. PTL 1.

In IV converter 1, a ratio (hereinafter referred to as S/N ratio) of a signal output from output terminal 7 to a noise largely depends on a capacitance of capacitive component 2.

CITATION LIST

Patent Literature

PTL 1: Japanese Patent Laid-Open Publication No. 2008-216187

SUMMARY

An IV converter includes a first operational amplifier connected to a capacitive component, a second operational amplifier connected to the first operational amplifier, and an impedance element connected to the second operational amplifier. The first operational amplifier includes a first input terminal connected to the capacitive component, a second input terminal connected to a reference potential, and first and second output terminals. The first output terminal is connected to the first input terminal to constitute a feedback loop. The second operational amplifier includes a third input terminal connected to the second output terminal, a fourth input terminal connected to a reference potential, and a third output terminal connected to the third input terminal via the impedance element to constitute a feedback loop. The phases of the currents output by the first and second output terminals of the first operational amplifier are substantially identical to each other.

This IV converter reduces a noise amount and improves an S/N ratio.

DETAIL DESCRIPTION OF PREFERRED EMBODIMENT

Figure 1:
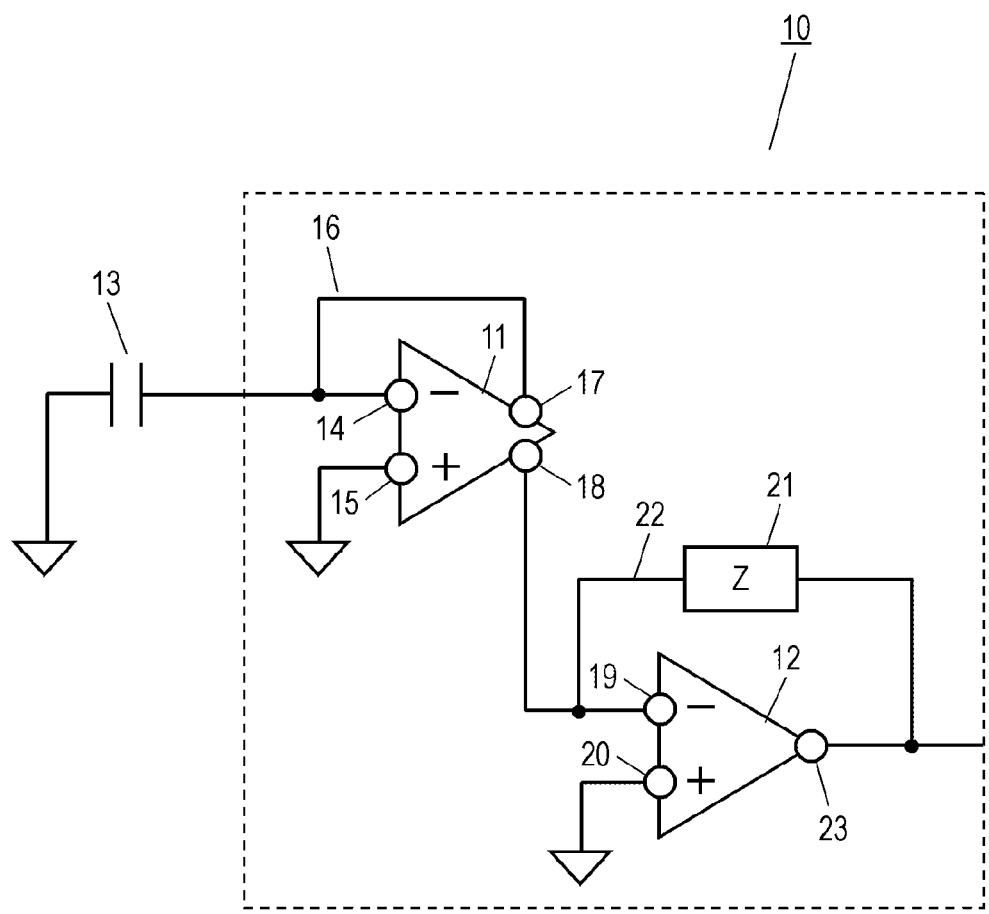
FIG. 1 is a block diagram of an IV converter according to an exemplary embodiment.

FIG. 1 is a block diagram of IV converter 10 according to a first exemplary embodiment. IV converter 10 includes operational amplifiers 11 and 12 and impedance element 21 connected to operational amplifier 12. Operational amplifier 11 includes input terminal 14 that is an inverted input terminal, input terminal 15 that is a non-inverted input terminal, and output terminals 17 and 18. Input terminal 14 is connected to capacitive component 13. Input terminal 15 is connected to a reference potential. Output terminal 17 is connected to input terminal 14 to constitute feedback loop 16. Operational amplifier 12 includes input terminal 19 that is an inverted input terminal, input terminal 20 that is a non-inverted input terminal, and output terminal 23. Input terminal 19 is connected to output terminal 18. Input terminal 20 is connected to the reference potential. Impedance element 21 has impedance, such as resistance. Output terminal 23 is connected to input terminal 19 via impedance element 21 to constitute feedback loop 22. IV converter 10 can convert a current flowing in capacitive component 13 into a voltage, and output the voltage from output terminal 23.

Figure 8:
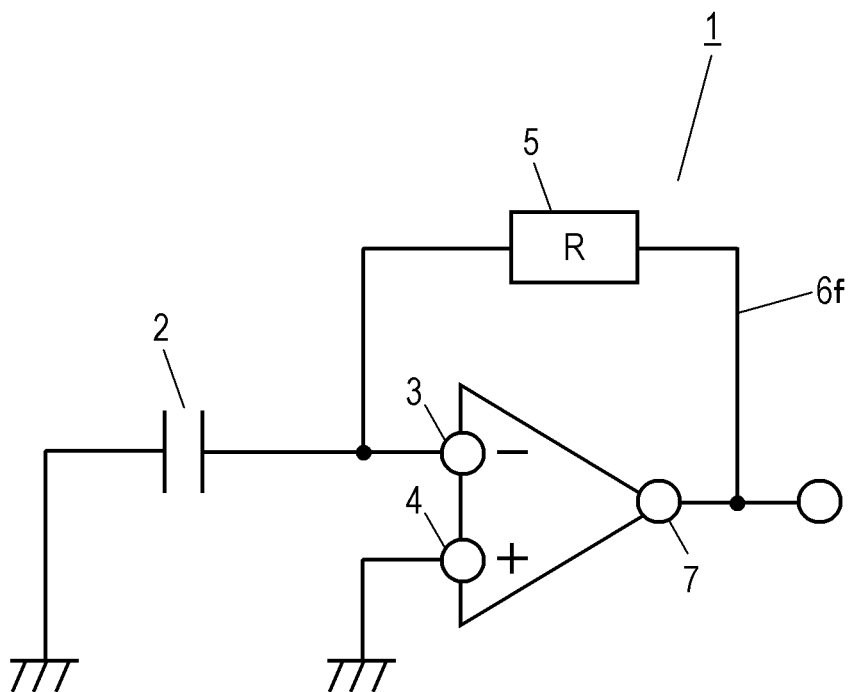
FIG. 8 is a block diagram of a conventional IV converter.

In conventional IV converter 1 shown in FIG. 8, a noise amount N of the signal output from output terminal 7 is expressed as Formula 1 with an input conversion noise Vn of IV converter 1, resistance R of resistor 5, frequency ω of the signal, and capacitance C of capacitive component 2.

$$N = Vn \times (R\omega C + 1) \qquad \text{(Formula 1)}$$

As shown in Formula 1, noise amount N increases in proportion to capacitance C of capacitive component 2. Therefore, a ratio of signal S to noise amount N of IV converter 1 (hereinafter referred to as S/N ratio) largely depends on capacitance C of capacitive component 2.

In IV converter 10 according to the embodiment shown in FIG. 1, the phase of the current output from output terminal 18 of operational amplifier 11 is substantially identical to the phase of the current output from output terminal 17. In this configuration, since capacitive component 13 connected to IV converter 10 is not connected directly with impedance element 21 in feedback loop 22, an input load capacitance of operational amplifier 12 can be reduced. As a result, capacitance C in Formula 1 can be so small that the noise amount of IV converter 10 can be reduced and the S/N can be improved.

Figure 2:
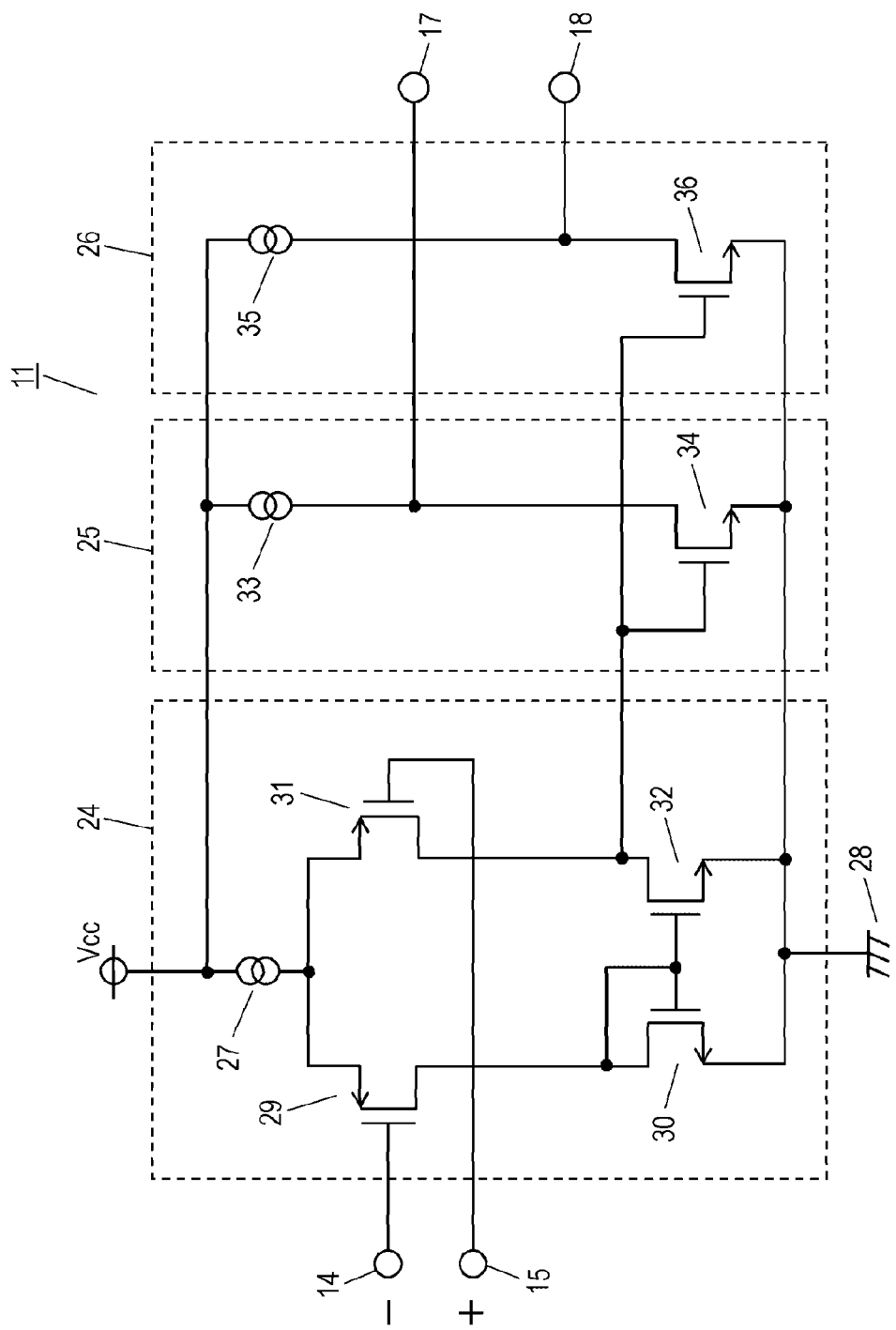
FIG. 2 is a circuit diagram of an operational amplifier of the IV converter according to the embodiment.

FIG. 2 is a circuit diagram of operational amplifier 11. Operational amplifier 11 having output terminal 17 connected to input terminal 14, to constitute feedback loop 16, but this connection is omitted in FIG. 2.

As shown in FIG. 2, operational amplifier 11 includes differential amplification circuit 24 for amplifying a difference voltage between the voltage of input terminal 14 and the voltage of input terminal 15, amplification circuit 25 for amplifying an output of differential amplification circuit 24 and outputs the amplified output to output terminal 17, and amplification circuit 26 for amplifying the output of differential amplification circuit 24 and outputs the amplified output to output terminal 18.

In differential amplification circuit 24, a drain of an electric field transistor (FET) 29 of P-channel is connected to a drain of FET 30 of N-channel connected, such that FETs 29 and 30 are connected in series between current source 27 and reference potential 28 to configure a series assembly. A drain of FET 31 of P-channel is connected to a drain of FET 32 of N-channel connected, such that FETs 31 and 32 are connected in series between current source 27 and reference potential 28 so as to be connected in parallel with the series assembly including FET 29 and FET 30. Input terminal 14 is connected to a gate of FET 29, and input terminal 15 is connected to a gate of FET 31. The gate of FET 30 and the gate of FET 32 are both connected to the drain of FET 29. The drain of FET 31 is connected to amplification circuits 25 and 26 of post-stage.

Amplification circuit 25 includes FET 34 of N-channel connected between current source 33 and reference potential 28. The drain of FET 31 is connected to a gate of FET 34. A drain of FET 34 is connected to output terminal 17.

Amplification circuit 26 includes FET 36 of N-channel connected between current source 35 and reference potential 28. The drain of FET 31 is connected to a gate of FET 36. A drain of FET 36 is connected to output terminal 18. Current sources 27, 33, and 35 are connected to power supply Vcc.

In operational amplifier 11 shown in FIG. 2 the phase of the current output from output terminal 17 can be substantially identical to the phase of the current output from output terminal 18.

A gain of amplification circuit 26 is preferably substantially identical to a gain of amplification circuit 25. This configuration allows a circuit from input terminals 14 and 15 to output terminal 17 to be identical to a circuit from input terminals 14 and 15 to output terminal 18, thereby reducing a conversion error of the input/output signals.

Operational amplifier 11 is implemented by a two-stage amplification circuit including differential amplification circuit 24 and amplification circuit 25, or by a two-stage amplification circuit including differential amplification circuit 24 and amplification circuit 26, but may be implemented by a plural-stage amplification circuit, such as three-stage amplification circuit or four-stage amplification circuit.

Figure 3:
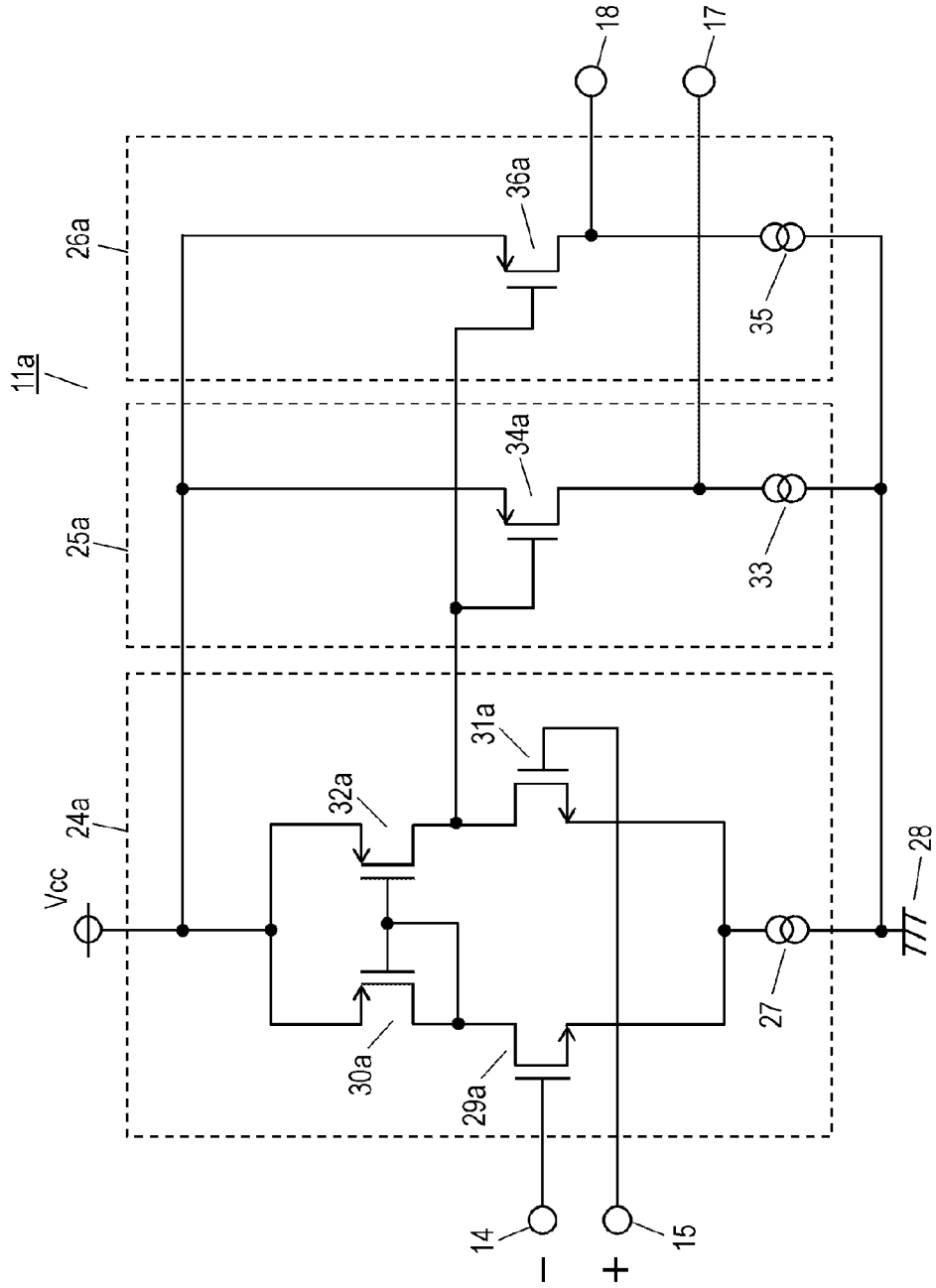
FIG. 3 is a circuit diagram of another operational amplifier of the IV converter according to the embodiment.

FIG. 3 is a circuit diagram of another operational amplifier 11a that can be used in place of operational amplifier 11 shown in FIGS. 1 and 2. In FIG. 3, components identical to components of operational amplifier 11 shown in FIG. 2 are denoted by the same reference numerals. In operational amplifier 11 shown in FIG. 2, FETs 29 and 31 of an initial stage are FETs of P-channel. In operational amplifier 11a shown in FIG. 3, FETs 29a and 31a of the initial stage are FETs of N-channel, and are connected with FETs 30a and 32a of P-channel between power supply Vcc, respectively, to constitute differential amplification circuit 24a. Amplification circuit 25a including FET 34a of P-channel and amplification circuit 26a including FET 36a of P-channel are connected to differential amplification circuit 24a to constitute operational amplifier 11a.

In other words, in differential amplification circuit 24a, the drain of FET 29a of N-channel is connected with the drain of FET 30a of P-channel connected, such that FETs 29a and 30a are connected in series between current source 27 and power supply Vcc to constitute a series assembly. The drain of FET 31a of N-channel is connected with the drain of FET 32a of P-channel, such that FETs 31a and 32a are connected in series between current source 27 and reference potential 28 so as to be connected in parallel with the series assembly including FET 29a and FET 30a. Input terminal 14 is connected with the gate of FET 29a, and input terminal 15 is connected with the gate of FET 31a. The gate of FET 30a and the gate of FET 32a are both connected to the drain of FET 29a. The drain of FET 31a is connected to amplification circuits 25a and 26a of the post-stage.

Amplification circuit 25a includes FET 34a of P-channel connected between current source 33 and power supply Vcc. The drain of FET 31a is connected to the gate of FET 34a. The drain of FET 34a is connected to output terminal 17.

Amplification circuit 26a includes FET 36a of P-channel connected between current source 35 and power supply Vcc. The drain of FET 31a is connected to the gate of FET 36a. The drain of FET 36a is connected to output terminal 18. Current sources 27, 33, and 35 are connected to reference potential 28.

Figure 4:
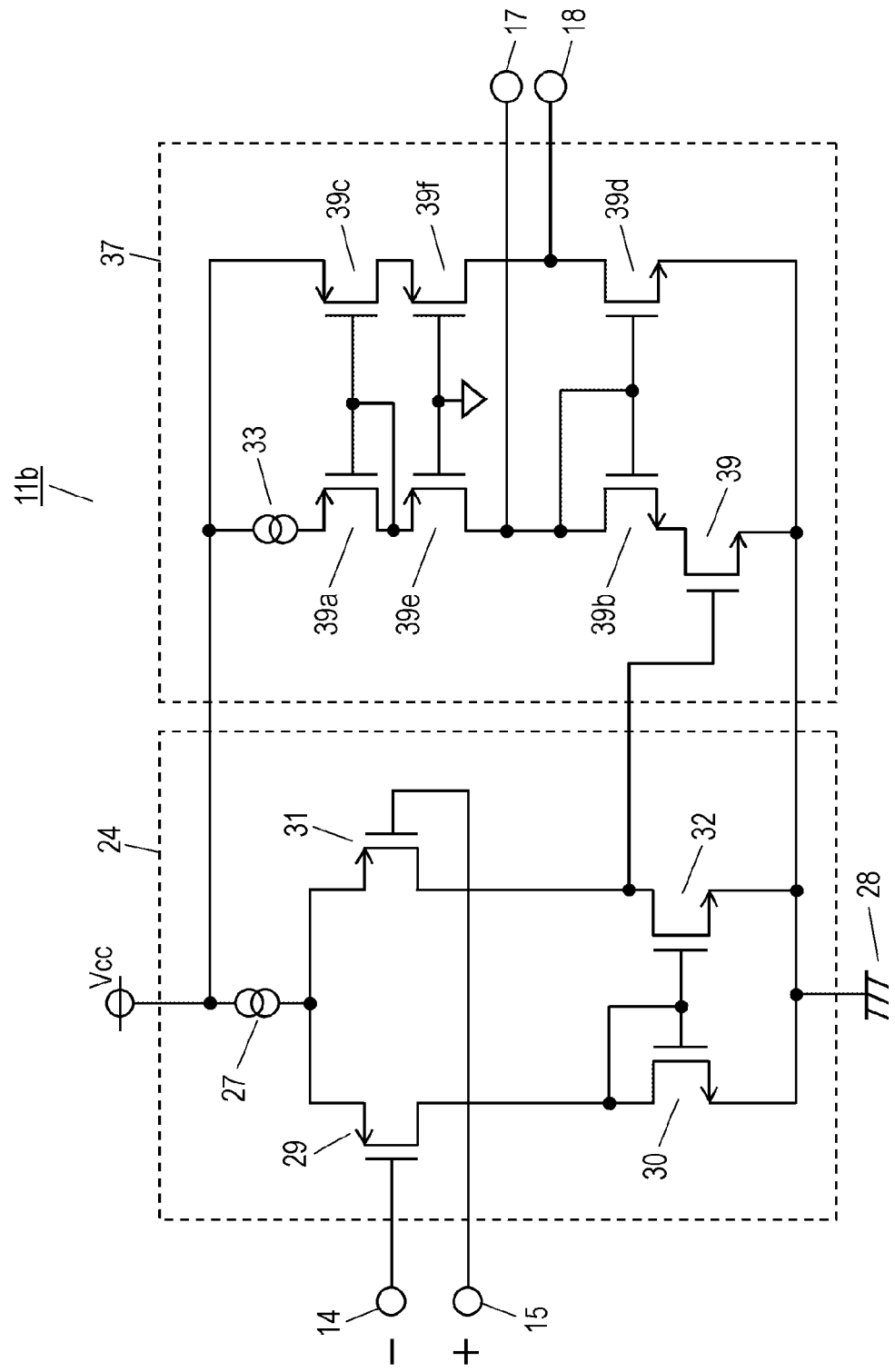
FIG. 4 is a circuit diagram of still another operational amplifier of the IV converter according to the embodiment.

FIG. 4 is a circuit diagram of still another operational amplifier 11b used in place of operational amplifier 11 shown in FIGS. 1 and 2. In FIG. 4, components identical to those of operational amplifier 11 shown in FIG. 2 are denoted by the same reference numerals. Operational amplifier 11b includes mirror circuit 37 disposed at the post-stage of differential amplification circuit 24 instead of amplification circuits 25 and 26 of operational amplifier 11 shown in FIG. 2. In mirror circuit 37, the drain of FET 31 is connected to the gate of FET 39 of N-channel, and FETs 39a and 39b are connected in series between current source 33 and the source of FET 39. FETs 39c and 39d are connected in series between power supply Vcc and reference potential 28. The source of FET 39b is connected to output terminal 17, and the source of FET 39d is connected to output terminal 18. In operational amplifier 11 shown in FIG. 2, the characteristics of FET 34 match with that of FET 36 to allow the gain of amplification circuit 25 to match with the gain of amplification circuit 26. Furthermore, the characteristics of FET 34a match with FET 36a to allow the gain of amplification circuit 25a to match with the gain of amplification circuit 26a in operational amplifier 11a shown in FIG. 3. In operational amplifier 11b shown in FIG. 4, mirror circuit 37 allows output terminals 17 and 18 to output signals substantially identical to each other with a simple configuration of mirror circuit 37. As shown in FIG. 4, FET 39e may be connected in series between FET 39a and FET 39b, FET 39f may be connected in series between FET 39c and FET 39d, and a cascode circuit including FET 39e and FET 39f may be disposed. This configuration can reduces a power supply dependency of the characteristics of FET 39a and FET 39c connected to the source side of the cascode circuit. Similarly, a cascode circuit may be provided at the drain side of FET 39b and FET 39d.

An inertial force sensor including IV converter 10 will be described below. The inertial force sensor according to the embodiment is an angular velocity sensor configured to detect an angular velocity.

Figure 5:
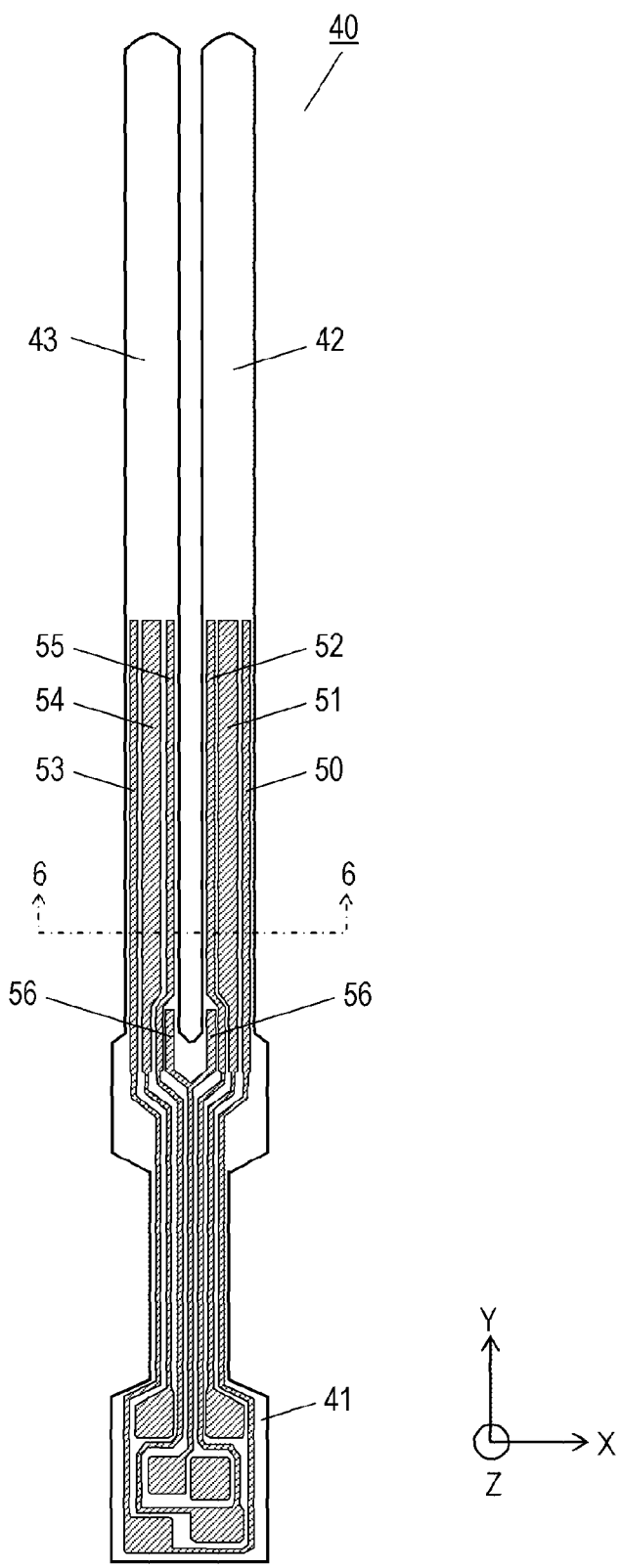
FIG. 5 is a top view of a detection element according to the embodiment.
Figure 6:
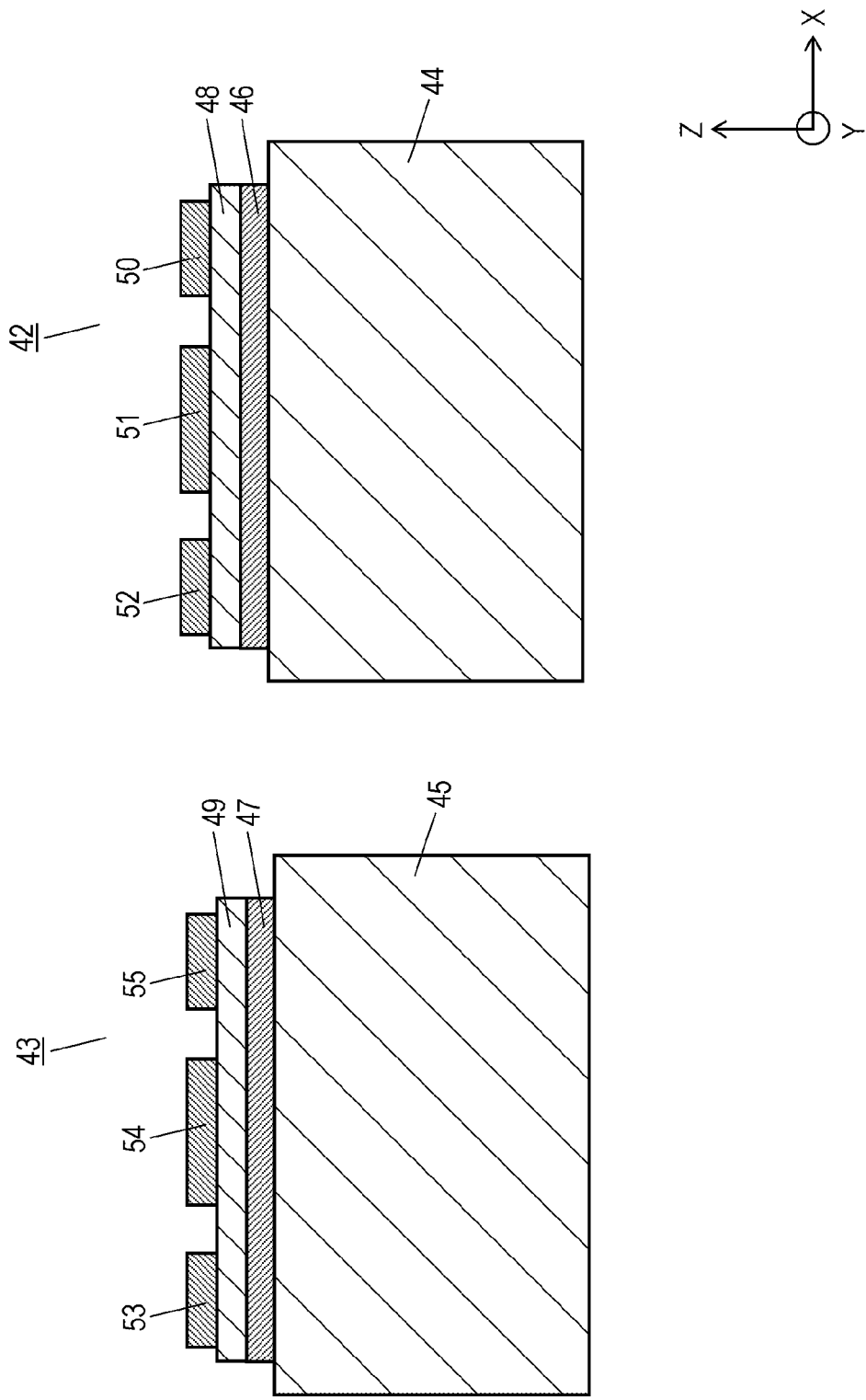
FIG. 6 is a cross-sectional view of the detection element at line 6-6 shown in FIG. 5.

FIG. 5 is a top view of detection element 40 of the angular velocity sensor. Detection element 40 is a tuning fork type detection element. FIG. 6 is a cross-sectional view of detection element 40 at line 6-6 shown in FIG. 5.

As shown in FIG. 5, detection element 40 has a tuning-fork shape including supporting unit 41 and arms 42 and 43 each having one end connected to supporting unit 41.

As shown in FIG. 6, detection element 40 includes tuning fork type silicon substrates 44 and 45, lower electrodes 46 and 47 disposed on upper surfaces of silicon substrates 44 and 45, piezoelectric thin films 48 and 49 disposed on upper surfaces of lower electrodes 46 and 47, respectively, upper electrodes 50, 51, and 52 disposed on an upper surface of piezoelectric thin film 48, and upper electrodes 53, 54, and 55 disposed on an upper surface of piezoelectric thin film 49. Upper electrodes 50, 52, 53, and 55 are drive electrodes 50, 52, 53, and 55, respectively. Upper electrodes 51 and 54 are detection electrodes 51 and 54, respectively. Lower electrodes 46 and 47 are connected to the reference potential.

Silicon substrates 44 and 45 are made of a semiconductor substrate, such as a silicon (Si) substrate, or a non-piezoelectric material, such as fused quartz or alumina. Silicon is preferably used so that a compact inertial force sensor can be manufactured using a microfabrication technique. Other layers, such as a barrier layer made of silicon dioxide film ($SiO_2$) or an adhesion layer made of titanium (Ti) may be formed on surfaces of silicon substrates 44 and 45.

Lower electrodes 46 and 47 are made of a single metal of at least one of copper, silver, gold, titanium, tungsten, platinum, chromium, and molybdenum, or an alloy containing such metals as the main component or a configuration in which such metals are layered. Lower electrodes 46 and 47 are preferably made of an alloy of platinum (Pt) containing Ti or TiOx, thereby providing electrodes 46 and 47 that have high electrical degree and that are stable in high temperature oxidant atmosphere. Other layers such as an orientation control layer made of titanate (lead titanate $PbTiO_2$) may be formed on the upper surfaces of lower electrodes 46 and 47.

Piezoelectric thin films 48 and 49 may be made of zinc oxide, lithium tantalate, lithium niobate, or potassium niobate. Preferably, lead titanate zirconate ($Pb(Zr,Ti)O_3$) is used for piezoelectric thin films 48 and 49 to provide the inertial force sensor with a sufficient piezoelectric property. Other layers, such as an adhesion layer made of titanium (Ti), may be formed on the upper surfaces of piezoelectric thin films 48 and 49.

Upper electrodes 50 to 55 may be made of a single metal consisting of at least one of copper, silver, gold, titanium, tungsten, platinum, chromium, and molybdenum, or an alloy having such metal as the main component or a configuration in which such metals are layered. Upper electrodes 50 to 55 are preferably made from gold (Au) to provide an electrode pattern having strong resistance to most of the chemical corrosions such as heat, humidity and oxygen.

According to the embodiment, a relative dielectric constant of piezoelectric thin films 48 and 49 is about 980. As described above, detection element 40 has a large capacitive component since piezoelectric thin films 48 and 49 are sandwiched by lower electrodes 46 and 47 and upper electrodes 50 to 55. The capacitive component may adversely affect the noise level of detection element 40.

A method of detecting the angular velocity using detection element 40 will be described below.

Upon having predetermined drive voltages applied to drive electrodes 50, 52, 53, and 55, detection element 40 vibrates (drive vibration) in an X-axis direction. When an angular velocity about a Y-axis is applied to the detection element 40 performing the drive vibration, arms 42 and 43 warp in a Z-axis direction due to a Coriolis force. Piezoelectric thin films 48 and 49 warp together with arms 42 and 43 and generate electric charges in detection electrodes 51 and 54. The amounts of the electric charges are proportional to the Coriolis force, and hence, allow the angular velocity to be detected.

Arms 42 and 43 of detection element 40 vibrate to be displaced in opposite directions along the X-axis direction, and hence, warp in opposite directions to each other in the Z axis direction due to the Coriolis force produced by the angular velocity about the Y-axis. Thus, the currents flowing based on the charges generated due to the Coriolis force in detection electrodes 51 and 54 have polarities opposite to each other.

Monitor electrode 56 shown in FIG. 5 is an electrode for extracting a signal having a frequency synchronized with the drive vibration. The signal detected by monitor electrode 56 is used for detecting in the detection circuit, described later.

Figure 7:
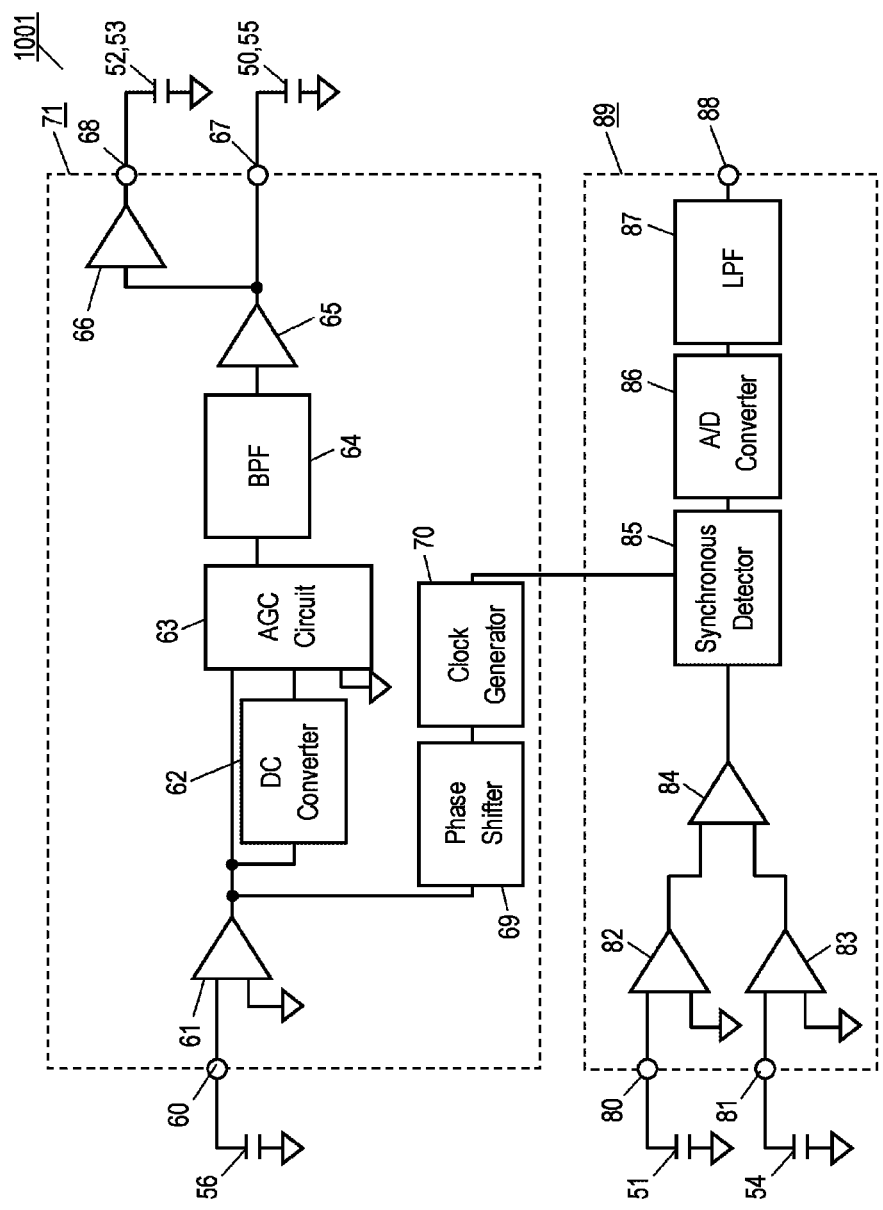
FIG. 7 is a circuit block diagram of an inertial force sensor according to the embodiment.

FIG. 7 is a circuit block diagram of inertial force sensor 1001 according to the embodiment. Inertial force sensor 1001 includes drive circuit 71 that drives and vibrates detection element 40, and detection circuit 89 that processes a signal output from detection element 40.

Drive circuit 71 includes monitor input terminal 60 electrically connected to monitor electrode 56, IV converter 61 for converting the monitor current to voltage, DC converter 62 for converting the monitor current (hereinafter referred to as monitor signal) converted to the voltage to a direct current (DC) signal, automatic gain control (AGC) circuit 63 for amplifying the monitor signal, band pass filter (BPF) 64 for removing unnecessary frequency components from the output of AGC circuit 63, output amplifier 65 for amplifying the output of band pass filter 64, inverting amplifier 66 for inverting the output of output amplifier 65, and drive output terminals 67 and 68 connected to drive electrodes 50, 52, 53, and 55 of detection element 40. Monitor input terminal 60 inputs, to drive circuit 71, the monitor current generated by the charges generated in monitor electrode 56 in synchronization with the drive vibration. AGC circuit 63 amplifies the monitor signal at a gain corresponding to the level of the output of DC converter 62.

Monitor input terminal 60 and drive output terminals 67 and 68 of drive circuit 71 are connected with drive electrodes 50, 52, 53, and 55 of detection element 40 to constitute a drive loop performing a self-excitation oscillation to apply the drive voltage to detection element 40. AGC circuit 63 is controlled such that the gain of AGC circuit 63 is decreased when the output of DC converter 62 increases, and that the gain of AGC circuit 63 is increased when the output of DC converter 62 decreases. This control allows the level of the monitor signal input to AGC circuit 63 to be substantially constant, and consequently allows the amplitude of the drive vibration to be constant. Phase shifter 69 shifts the phase of the monitor signal converted to voltage in IV converter 61 by 90 degrees, and outputs the drive signal with the shifted phase. Clock generator 70 generates a clock signal having a rectangular wave for synchronous detection using the output of the phase shifter.

Detection circuit 89 includes input terminals 80 and 81 electrically connected to detection electrodes 51 and 54 of detection element 40, respectively, IV converters 82 and 83, differential amplifier 84, synchronous detector 85, A/D converter 86, low pass filter (LPF) 87, and output terminal 88. Synchronous detector 85 performed the synchronous detection using the clock signal output from clock generator 70.

The currents having polarities opposite to each other generated in detection electrodes 51 and 54 of detection element 40 are converted to voltages having polarities opposite to each other by IV converters 82 and 83. The difference of the converted voltages is calculated by differential amplifier 84 to sum the voltages having polarities opposite to each other. The output of differential amplifier 84 is input to synchronous detector 85, is synchronously detected with respect to the clock signal output from clock generator 70, and is converted to a digital signal by A/D converter 86. The unnecessary signals are removed from the digital signal with low pass filter 87. The digital signal is output from output terminal 88.

According to the embodiment, IV converter 10 shown in FIG. 1 is used as IV converters 82 and 83. In other words, detection electrode 51 of detection element 40 is connected to input terminal 14 of IV converter 10 (82) through input terminal 80, and output terminal 23 is connected to one of input terminals of differential amplifier 84. Detection electrode 54 of detection element 40 is connected to input terminal 14 (81) of IV converter 10 (83) through input terminal 81, and output terminal 23 is connected to another input terminal of differential amplifier 84.

As described above, detection element 40 has a configuration in which piezoelectric thin films 48 and 49 are sandwiched by lower electrodes 46 and 47 and upper electrodes 50 to 55, thus having a large capacitive component. IV converter 10 is used as IV converters 82 and 83 for converting the currents output from detection electrodes 51 and 54 to voltages to allow the capacitive component of detection element 40 connected to IV converters 82 and 83 not to be directly connected to impedance element 21 in feedback loop 22, hence reducing the input load capacitance in operational amplifier 12. This configuration can reduce the noise amount caused by the capacitive component including piezoelectric thin films 48 and 49, lower electrodes 46 and 47 and upper electrodes 50 to 55, hence improving the S/N ratio of inertial force sensor 1001.

IV converter 10 shown in FIG. 1 can be used as IV converters 82 and 83. This configuration allows the phase of a current output from output terminal 18 to be substantially identical to the phase of a current output from output terminal 17.

INDUSTRIAL APPLICABILITY

An IV converter according to the present invention can reduce a noise amount and improve an S/N ratio, hence being useful in automobiles, airplanes, ships, robots, and various other electronic devices.

REFERENCE MARKS IN THE DRAWINGS

10 IV Converter
11 Operational Amplifier (First Operational Amplifier)
12 Operational Amplifier (Second Operational Amplifier)
13 Capacitive Component
14 Input Terminal (First Input Terminal)
15 Input Terminal (Second Input Terminal)
16, 22 Feedback Loop
17 Output Terminal (First Output Terminal)
18 Output Terminal (Second Output Terminal)
19 Input Terminal (Third Input Terminal)
20 Input Terminal (Fourth Input Terminal)
21 Impedance Element
23 Output Terminal (Third Output Terminal)
24 Differential Amplification Circuit
25 Amplification Circuit (First Amplification Circuit)
26 Amplification Circuit (Second Amplification Circuit)

The invention claimed is:

1. An IV converter configures to convert a current flowing in a capacitive component into a voltage, the IV converter comprising:
a first operational amplifier configured to be connected to the capacitive component;
a second operational amplifier connected to the first operational amplifier; and
an impedance element connected to the second operational amplifier,
wherein the first operational amplifier includes:
a first input terminal connected to the capacitive component;
a second input terminal connected to a reference potential;
a first output terminal connected to the first input terminal to constitute a feedback loop; and
a second output terminal,
wherein the second operational amplifier includes:
a third input terminal connected to the second output terminal;
a fourth input terminal connected to a reference potential; and
a third output terminal connected to the third input terminal via the impedance element to constitute a feedback loop, and
wherein a phase of a current output from the second output terminal of the first operational amplifier is substantially identical to a phase of a current output from the first output terminal of the first operational amplifier.

2. The IV converter according to claim 1, wherein an amplitude of the current output from the second output terminal of the first operational amplifier is substantially identical to an amplitude of the current output from the first output terminal of the first operational amplifier.

3. The IV converter according to claim 1, wherein the first operational amplifier further includes:
a differential amplification circuit that amplifies a difference between an voltage of the first input terminal and an voltage of the second input terminal;
a first amplification circuit that amplifies an output of the differential amplification circuit and outputs the amplified output to the first output terminal; and
a second amplification circuit that amplifies an output of the differential amplification circuit and outputs the amplified output to the second output terminal.

4. The IV converter according to claim 3, wherein a gain of the first amplification circuit is substantially identical to a gain of the second amplification circuit.

5. The IV converter according to claim 1, wherein the first operational amplifier further includes:
a differential amplification circuit that amplifies a difference voltage between an voltage of the first input terminal and an voltage of the second input terminal; and
a mirror circuit that amplifies an output of the differential amplification circuit, and outputs a substantially identical signal to the first output terminal and the second output terminal.

6. An inertial force sensor comprising:
an inertial force sensor element including a capacitive component, the inertial force sensor configured to output a current corresponding to an inertial force applied thereto;
an IV converter that converts the current to a voltage; and
a detection circuit that detects the inertial force,
wherein the IV converter includes:
a first operational amplifier connected to the inertial force sensor;
a second operational amplifier connected to the first operational amplifier; and
an impedance element connected to the second operational amplifier, wherein the first operational amplifier includes:
  a first input terminal connected to the capacitive component;
  a second input terminal connected to a reference potential;
  a first output terminal connected to the first input terminal to constitute a feedback loop; and
  a second output terminal,
wherein the second operational amplifier includes:
  a third input terminal connected to the second output terminal;
  a fourth input terminal connected to a reference potential, and
  a third output terminal connected to the third input terminal via the impedance element to constitute a feedback loop,
wherein a phase of a current output by the second output terminal of the first operational amplifier is substantially identical to a phase of a current output by the first output terminal of the first operational amplifier, and
wherein the detection circuit detects the inertial force based on a signal output from the third output terminal.

* * * * *